US008920564B2

(12) United States Patent
Tzu et al.

(10) Patent No.: US 8,920,564 B2
(45) Date of Patent: Dec. 30, 2014

(54) METHODS AND APPARATUS FOR THERMAL BASED SUBSTRATE PROCESSING WITH VARIABLE TEMPERATURE CAPABILITY

(75) Inventors: Gwo-Chuan Tzu, Sunnyvale, CA (US); Xiaoxiong Yuan, San Jose, CA (US); Amit Khandelwal, San Jose, CA (US); Benjamin Cheng Wang, San Jose, CA (US); Avgerinos V. Gelatos, Redwood City, CA (US); Kai Wu, Palo Alto, CA (US); Michael P. Karazim, San Jose, CA (US); Jing Lin, Mountain View, CA (US); Olkan Cuvalci, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 631 days.

(21) Appl. No.: 13/169,373

(22) Filed: Jun. 27, 2011

(65) Prior Publication Data
US 2012/0003388 A1    Jan. 5, 2012

Related U.S. Application Data (60) Provisional application No. 61/361,141, filed on Jul. 2, 2010.

(51) Int. Cl.
| C23C 16/00 | (2006.01) |
| C23C 16/44 | (2006.01) |
| C23C 16/455 | (2006.01) |
| C23C 16/52 | (2006.01) |
| C23C 16/458 | (2006.01) |
| C23C 16/46 | (2006.01) |

(52) U.S. Cl.
CPC ....... *C23C 16/4412* (2013.01); *C23C 16/45587* (2013.01); *C23C 16/52* (2013.01); *C23C 16/45565* (2013.01); *C23C 16/4585* (2013.01); *C23C 16/46* (2013.01)
USPC ............... 118/724; 156/345.3; 156/345.53; 156/345.37

(58) Field of Classification Search
USPC .................................................. 118/915, 504
See application file for complete search history.

(56) References Cited

U.S. PATENT DOCUMENTS

| 5,304,248 A | * | 4/1994 | Cheng et al. ................. 118/728 |
| 5,326,725 A | * | 7/1994 | Sherstinsky et al. .......... 438/778 |

(Continued)

FOREIGN PATENT DOCUMENTS

JP    2002-164323 A    6/2002

OTHER PUBLICATIONS

International Search Report and Written Opinion mailed Feb. 9, 2012 for PCT Application No. PCT/US2011/042125.

*Primary Examiner* — Gordon R Baldwin
*Assistant Examiner* — Charlee Bennett
(74) *Attorney, Agent, or Firm* — Moser Taboada; Alan Taboada (57) ABSTRACT

A substrate support may include a body; an inner ring disposed about the body; an outer ring disposed about the inner ring forming a first opening therebetween; a first seal ring disposed above the first opening; a shadow ring disposed above the inner ring, extending inward from the outer ring and forming a second opening between the shadow and outer rings; a second seal ring disposed above the second opening; a space at least partially defined by the body and the inner, outer, first, second, and shadow rings; a first gap defined between a processing surface of a substrate when present and the shadow ring; and a plurality of second gaps fluidly coupled to the space; wherein the first gap and the plurality of second gaps are configured such that, when a substrate is present, a gas provided to the space flows out of the space through the first gap.

12 Claims, 5 Drawing Sheets

(56) References Cited

U.S. PATENT DOCUMENTS

| | | | |
|---|---|---|---|
| 5,632,873 A * | 5/1997 | Stevens et al. | 204/298.15 |
| 5,855,687 A * | 1/1999 | DuBois et al. | 118/729 |
| 5,922,133 A * | 7/1999 | Tepman et al. | 118/720 |
| 6,096,135 A * | 8/2000 | Guo et al. | 118/729 |
| 6,190,496 B1 * | 2/2001 | DeOrnellas et al. | 156/345.44 |
| 6,296,712 B1 * | 10/2001 | Guo et al. | 118/728 |
| 6,328,808 B1 * | 12/2001 | Tsai et al. | 118/729 |
| 6,350,320 B1 * | 2/2002 | Sherstinsky et al. | 118/715 |
| 6,364,949 B1 * | 4/2002 | Or et al. | 118/69 |
| 6,454,865 B1 * | 9/2002 | Goodman et al. | 118/728 |
| 6,589,352 B1 * | 7/2003 | Yudovsky et al. | 118/729 |
| 6,663,714 B2 * | 12/2003 | Mizuno et al. | 118/719 |
| 6,716,287 B1 * | 4/2004 | Santiago et al. | 118/729 |
| 6,885,206 B2 * | 4/2005 | Halley | 324/756.01 |
| 7,670,436 B2 * | 3/2010 | Miller et al. | 118/728 |
| 7,699,934 B2 * | 4/2010 | Kai | 118/728 |
| 7,704,327 B2 * | 4/2010 | Waldhauer et al. | 118/724 |
| 7,993,457 B1 * | 8/2011 | Krotov et al. | 118/719 |
| 8,342,119 B2 * | 1/2013 | Yudovsky et al. | 118/500 |
| 8,522,715 B2 * | 9/2013 | Fischer | 118/723 R |
| 8,580,092 B2 * | 11/2013 | Hawrylchak et al. | 204/298.11 |
| 8,622,021 B2 * | 1/2014 | Taylor et al. | 118/723 R |
| 8,755,680 B2 * | 6/2014 | Koelmel et al. | 392/418 |
| 2002/0144786 A1 * | 10/2002 | Chiang et al. | 156/345.51 |
| 2003/0062128 A1 | 4/2003 | Denpoh | |
| 2004/0003780 A1 * | 1/2004 | Yudovsky et al. | 118/728 |
| 2005/0051100 A1 * | 3/2005 | Chiang et al. | 118/728 |
| 2006/0090706 A1 * | 5/2006 | Miller et al. | 118/728 |
| 2007/0044719 A1 * | 3/2007 | Ku et al. | 118/728 |
| 2007/0169891 A1 | 7/2007 | Koshiishi et al. | |
| 2007/0283884 A1 * | 12/2007 | Tiller et al. | 118/715 |
| 2008/0069951 A1 * | 3/2008 | Chacin et al. | 427/248.1 |
| 2008/0178801 A1 * | 7/2008 | Pavloff et al. | 118/504 |
| 2008/0182412 A1 * | 7/2008 | Bailey, III et al. | 438/689 |
| 2008/0210379 A1 | 9/2008 | Miyagawa et al. | |
| 2009/0017635 A1 * | 1/2009 | Shah et al. | 438/729 |
| 2009/0056629 A1 * | 3/2009 | Katz et al. | 118/723 R |
| 2009/0223930 A1 * | 9/2009 | Kwon et al. | 216/67 |
| 2012/0175063 A1 * | 7/2012 | Yamawaku et al. | 156/345.46 |
| 2013/0247826 A1 * | 9/2013 | Tzu et al. | 118/725 |
| 2013/0255576 A1 * | 10/2013 | Rasheed et al. | 118/723 R |
| 2013/0264015 A1 * | 10/2013 | Fang et al. | 156/345.48 |

* cited by examiner

METHODS AND APPARATUS FOR THERMAL BASED SUBSTRATE PROCESSING WITH VARIABLE TEMPERATURE CAPABILITY

CROSS-REFERENCE TO RELATED APPLICATIONS

This application claims benefit of U.S. provisional patent application Ser. No. 61/361,141, filed Jul. 2, 2010, which is herein incorporated by reference.

FIELD

Embodiments of the present invention generally relate to methods and apparatus for substrate processing.

BACKGROUND

Single substrate processing systems may be used for thermal-based substrate processing, such as thermal chemical vapor deposition (CVD) or the like. Accordingly, the inventors provide methods and apparatus for thermal-based substrate processing.

However, the inventors believe that there are certain process limitations associated with such chambers, such as the inability to rapidly alter the heater temperature to provide variable temperature process capability.

Thus, the inventors have provided embodiments of improved single substrate processing chambers.

SUMMARY

Methods and apparatus for thermal-based substrate processing with variable temperature capability are provided. In some embodiments, a substrate support may include a body having a substrate-facing surface; an inner ring disposed about the body; an outer ring disposed about the inner ring, wherein a first opening is formed between the inner and outer rings; a first seal ring disposed above the first opening; a shadow ring disposed above the inner ring, the shadow ring extending inward from the outer ring, wherein a second opening is formed between the shadow ring and the outer ring; a second seal ring disposed above the second opening; a space at least partially defined by the body, the inner ring, the outer ring, the first seal ring, the second seal ring, and the shadow ring; a first gap defined between a processing surface of a substrate when present on the substrate support and a space-facing surface of the shadow ring; and a plurality of second gaps, one second gap defined between each of the first seal ring and the inner ring, the first seal ring and the outer ring, the second seal ring and the shadow ring, and the second seal ring and the outer ring; wherein the first gap and the plurality of second gaps are configured such that, when a substrate is disposed between the body and the shadow ring, a gas provided to the space flows out of the space through the first gap.

In some embodiments, a substrate processing system includes a processing chamber having an inner volume; an inlet to provide a process gas to the inner volume; an exhaust coupled to the inner volume to facilitate removal of one or more gases from the process chamber; and a substrate support disposed in the inner volume and below the inlet, the substrate support as described in any of the embodiments disclosed herein.

In some embodiments, a method of processing a substrate may include positioning a substrate in a process chamber between a substrate heater and a showerhead; controlling a first distance between the substrate and the showerhead and a second distance between the substrate and the substrate heater to control a temperature of the substrate; providing a flow of a purge gas through a space at least partially defined between a backside of the substrate and an exhaust of the process chamber; controlling the size of a first gap defined between a shadow ring disposed over a frontside of the substrate proximate the edge of the substrate and the upper surface of substrate, wherein the first gap is fluidly coupled to the space; and controlling the size of one or more second gaps in the space such that a positive flow of the purge gas is provided through the first gap.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of the present invention related to methods and apparatus for thermally processing substrates with variable temperature control. Embodiments of the inventive methods and apparatus may provide for rapid adjustment of the substrate temperature, for example, to provide for variable temperature process capability. Embodiments of the inventive methods and apparatus may facilitate substrate processing with adjustable pressure and temperature in a single substrate process chamber having increased process tuning parameters, enhanced flexibility of processing, and with a more robust process without any added cost.

Using the methods and apparatus disclosed herein, variable temperature substrate processing may be achieved at a fixed heater setpoint by controlling the distance between a substrate and a heater (or a heat source) and the substrate and a chamber lid or a showerhead (heat sink, maintained at lower temperature setpoint with use of heat exchanger). The distance may be controlled with use of lift pins, support pins, or self alignment fingers extending under the backside of the substrate. Methods and apparatus to control the flow path for edge gases or purge gases provided to the edge of the substrate facilitate desired deposition on the frontside of the substrate held at a distance from heater without undesirable film deposition on substrate bevel or backside.

Figure 1:
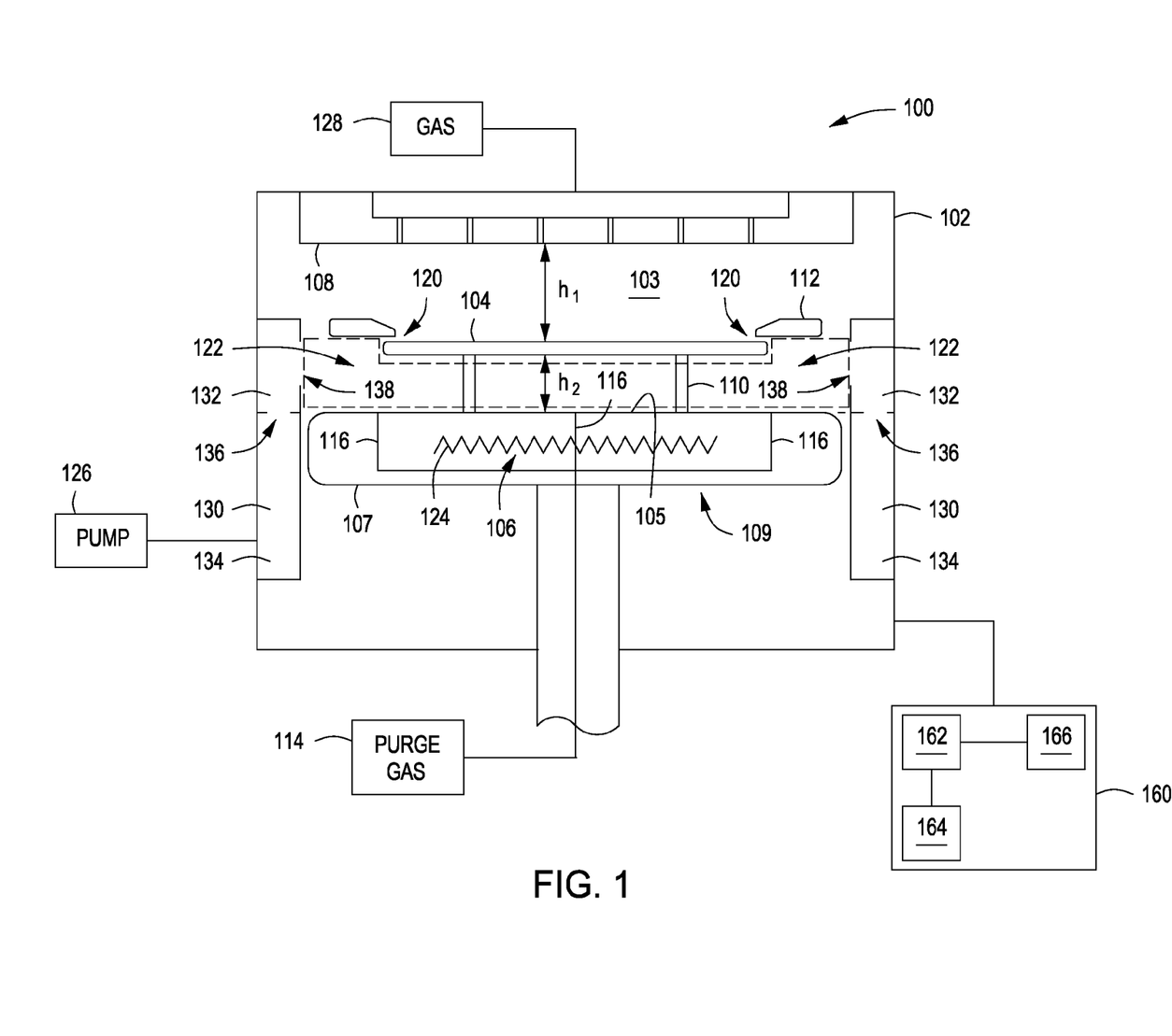
FIG. 1 depicts a schematic side view of a substrate processing system in accordance with some embodiments of the present invention.

FIG. 1 depicts a schematic side view of a substrate processing system 100 in accordance with some embodiments of the present invention. The system 100 may includes a process chamber 102 having an inner volume 103 for processing a substrate 104 therein. The process chamber 102 may be configured to control the position of the substrate 104 within the process chamber 102 such that one or more of a first distance h1 and a second distance h2 may be controlled. The first distance, h1, may be defined between a frontside of the substrate 104 and a showerhead 108 disposed in the process chamber 102 above the substrate 104 (or a ceiling of the process chamber 102 when no showerhead is present). The second distance, h2, may be defined between a backside of the substrate 104 and a substrate-facing surface 105 of a body 107 of a substrate support 109. The substrate support 109 may include a heater 106 disposed in the body 107. Alternatively, the second distance, h2, may be defined between the backside of the substrate 104 and the heater 106 (not shown). Although the heater 106 is illustrated in FIG. 1 as a resistive element 124 incorporated into the substrate support 109, other geometries or heating mechanisms, such as radiative lamps, may be used alternatively or in combination. For example, in some embodiments, the heater 106 may be replaced with just the substrate support 107 and the substrate 104 may be heated by another heater, for example, a heater not included in the substrate support 107 (not shown).

The showerhead 108 (e.g., a gas inlet) may be coupled to a process gas source 128 for providing one or more process gases to the inner volume 103 of the process chamber 102 for carrying out processes in the process chamber. For example, in some embodiments, the process chamber 102 may be configured for thermal CVD processes such as the deposition of, in a non-limiting example, tungsten or tungsten-containing materials. Alternatively or in combination, other gas inlets may be provided to introduce and distribute process gases into the process chamber 102, such as nozzles or inlets disposed about the process chamber 102, in the ceiling of the process chamber, and/or within the process chamber about the substrate 104, or the like.

The substrate 104 may be supported above the heater 106 and/or the substrate-facing surface 105 of the body 107 by any suitable means, such as a plurality of support pins 110 to support the substrate 104 when present on the substrate support 109. The support pins 110 may rest atop the body 107, or may be disposed in or through the heater 106 and/or body 107. Each support pin 110 may be moveable relative to the substrate-facing surface 105 of the body 107 to control a distance between the substrate 104 when present on the plurality of support pins 110 and the substrate-facing surface 105 of the body 107. For example, each support pin 110 may be positionable to control the height of the substrate 104 above the heater 106 and/or substrate-facing surface 105 of the body 107 (e.g., h2) and the height between the substrate 104 and the showerhead 108 (e.g., h1). The heater 106 and/or body 107 may also be vertically positionable to move between various processing positions within the process chamber 102. The heater 106 and/or body 107 may be moveable relative to the plurality of support pins 110 to control a distance between the substrate 104 when present on the plurality of support pins 110 and the substrate-facing surface 105 of the body 107. For example, the heater 106 and/or body 107 may be movable at least between a lower position for loading and unloading the substrate 104, such as through an opening (not shown) formed in the side of the process chamber 102, and an upper position for processing the substrate 104. In some embodiments, the heater 106 and/or body 107 may be movable at various discrete points or continuously between the lower and upper positions.

The position of the substrate 104 within the chamber may be controlled via the position of the heater 106 (or body 107), and the length that the support pins 110 extend above the upper surface of the heater 106. The heater 106 and the support pins 110 may be positioned such that the substrate 104 is spaced at a first distance (e.g., h1) from the ceiling or showerhead 108 and at a second distance (e.g., h2) from the heater 106.

The process chamber 102 further includes an exhaust 130 coupled to the inner volume 103 to facilitate removal of one or more gases from the process chamber 102. The exhaust 130 is coupled to a pump 126 for removing process gases, purge gases, processing byproducts, and the like from the process chamber 102, for example, via one or more openings 138 fluidly coupling the processing region of the process chamber 102 with the exhaust 130. For example, the one or more openings 138 may be arranged about a periphery of the substrate support 109, where each opening 138 may be fluidly coupled to a space 122 via first and second openings 212, 228 and a first gap 120 as discussed below and illustrated in FIGS. 2-3. In some embodiments, the exhaust 130 may be disposed about the walls of the process chamber 102 and may further be split into an upper exhaust 132 and a lower exhaust 134 with one or more openings 136 disposed between the upper and lower exhaust 132, 134 to control the flow of the process gases, etc., through the exhaust 130 and to the pump 126 (e.g., to provide more azimuthally uniform flow from the processing region of the process chamber above the substrate to the exhaust 130 due to the asymmetric pump configuration). The exhaust 130 including the upper and lower exhaust 132, 134 and the one or more openings 136, 138 are illustrated in added detail in FIGS. 2-3.

A shadow ring 112 may be disposed over a frontside of the substrate 104 proximate the edge of the substrate 104 and the frontside of substrate 104. The position of the shadow ring 112 may be controlled to control the size of a first gap 120 defined between the frontside of the substrate 104 and the shadow ring 112. The position of the shadow ring 112 may be controlled by any suitable means, such as by mechanically holding or supporting the shadow ring 112 on other components of the process chamber 102 (not shown in FIG. 1).

A purge gas, for example an inert gas, such as argon, may be provided by a purge gas source 114 to a purge gas passageway, or space 122 defined between a backside of the substrate 104 and the exhaust 130 of the process chamber 102 (approximated in dashed lines in FIG. 1). The space 122 is shown in further detail in FIGS. 2-3 and described below. One or more conduits 116 may be provided through the body 107 to provide the purge gas to the space 122 proximate a central axis of the substrate 104 and/or proximate the edge of the substrate 104 as illustrated in FIG. 1, or alternatively to any suitable desired location on the backside of the substrate 104. For example, in some embodiments at least some of the one or more conduits 116 may be disposed in the substrate-facing surface 105 of the body 107.

The size of the first gap 120 between the shadow ring 112 and the substrate 104 may be controlled in combination with the size of one or more openings (or second gaps) in the space 122 such that a positive flow of the purge gas is provided through the first gap 120, as discussed in more detail below.

Figure 2:
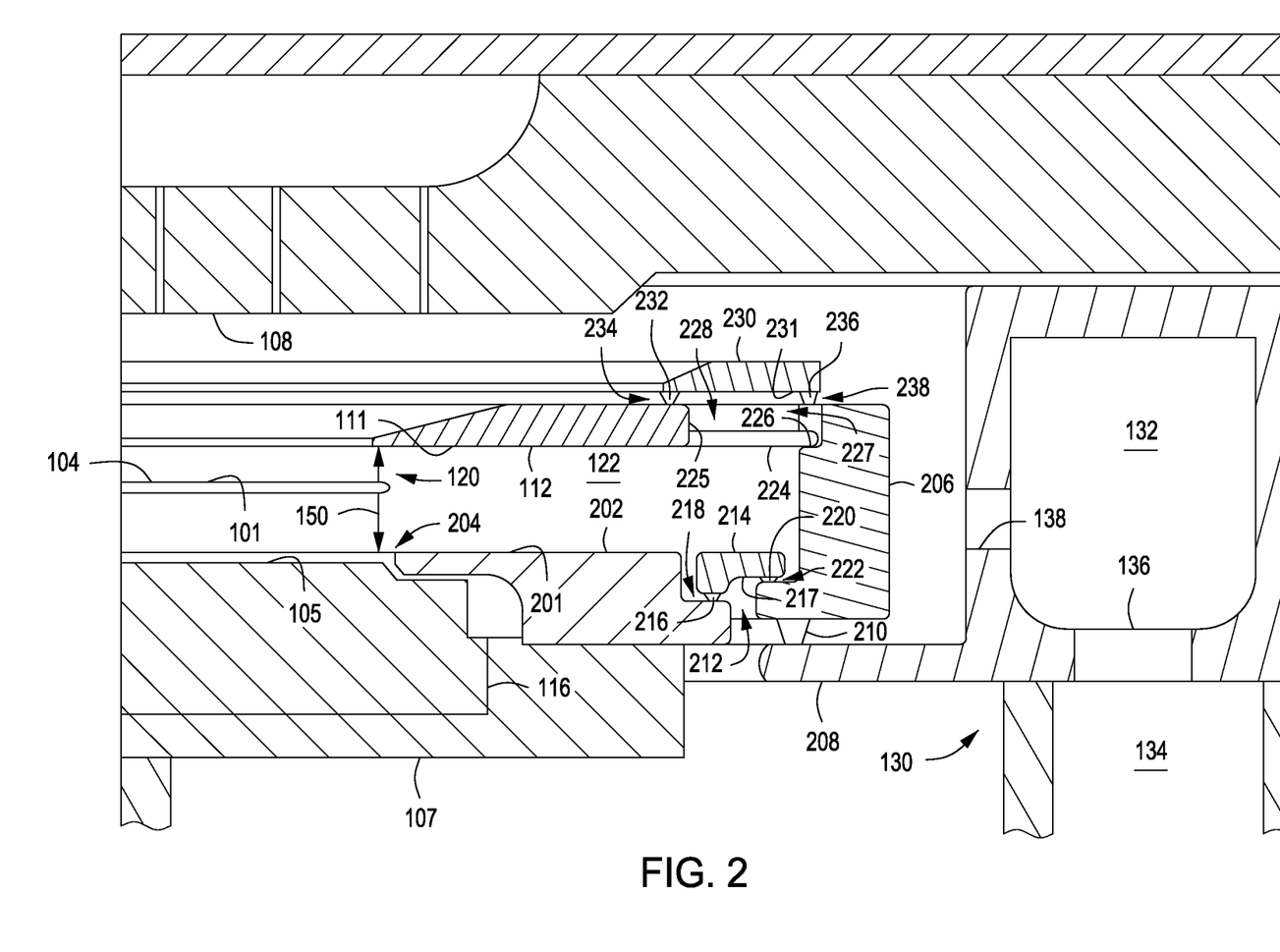
FIG. 2 depicts a detailed cross-sectional side view of a portion of a process chamber in accordance with some embodiments of the present invention.

For example, FIG. 2 depicts a detailed cross-sectional side view of a portion of the process chamber 102 in accordance with some embodiments of the present invention. As illustrated in FIG. 2, the substrate support 109 may include an inner ring 202 disposed about the body 107. The inner ring may be coupled to or may rest upon an upper peripheral surface of the body 107. The body 107 may have a ledge or other features formed in the upper peripheral surface to support the inner ring 202 in a desired position. In some embodiments, the inner ring may have an upper surface that is disposed above the substrate-facing surface 105 of the body 107 (although, generally, the upper surface can be higher, lower, or equal to the substrate-facing surface 105). In some embodiments, the upper surface may be disposed above the substrate-facing surface 105 by a distance greater than a thickness of the substrate 104 by an amount equal to a desired thickness for the gap 120. For example, in operation for some processes, the substrate may be supported directly on the surface 105 of the body 107, and the body 107 may be moved upward sufficiently to pick up, or elevate the shadow ring 112. The space 122 will be reduced to zero, however, the bottom surface of the shadow ring 112 will be higher than the top surface of the substrate 104 due to the inner ring 202, thereby maintaining the gap 120 at a desired size to facilitate flow of the substrate edge purge gas (discussed below) through the gap 120 to maintain edge and bevel exclusion during processing. In such a position, because the substrate 104 will be positioned directly on the body 107, the temperature of the substrate 104 will increase to the temperature of the body 107 (e.g., of the heater 106), thereby facilitating processing the substrate 104 at a higher temperature than when the substrate 104 is held at an elevated position with respect to the body 107. Although the gap 120 is discussed above as being provided by interference between the inner ring 202 and the shadow ring 115, other features or components may be used instead to provide the relative position of these components in order to define the gap 120 (and any other second gaps as discussed herein). In some embodiments, the inner ring 202 may further include an outwardly extending flange or other suitable feature to support other components (such as the first seal ring 214, discussed below). In some embodiments, the inner ring 202 may be at least partially separated from the body 107, such that a passage 204 may be formed between the body 107 and the inner ring 202. For example, the passage 204 may fluidly couple at least some of the one or more conduits 116 to the space 122 to facilitate providing a purge gas near an outer edge of the substrate 104, when present on the substrate support 109 (for example, as discussed above). The inner ring 202 may comprise any suitable material, such as one or more of aluminum nitride, alumina ($Al_2O_3$), or the like.

The substrate support 109 may include an outer ring 206 disposed about the inner ring 202 as illustrated in FIG. 2. The outer ring 206 may include an inner ledge 207 disposed proximate a lower portion of the inner ring 202 to support other components (such as the first seal ring 214, discussed below). The outer ring 206 may further include one or more shelves 226 disposed in a shadow ring-facing surface 227 of the outer ring 206 proximate an upper portion of the outer ring 206. The one or more shelves 226 may support other components, such as the shadow ring 112 (as discussed below).

The outer ring 206 may be supported by a flange 208 of the exhaust 130 that extends inwardly from the exhaust 130. The outer ring 206 may be supported on the flange 208 via a plurality of protrusions 210. The protrusions 210 may extend from the outer ring 206, from the flange 208, or both. The plurality of protrusions 210 may have any desired size to control the size of a gap between the outer ring 206 and the flange 208. For example, the plurality of protrusions may be provided at a size suitable for predominantly limiting flow of the purge gas from the space 122 through an opening formed between the flange 208 and the outer ring 206. The outer ring 206 may comprise any suitable materials, such as one or more of aluminum nitride, alumina ($Al_2O_3$), or the like. The flange 208 of the exhaust may also be spaced apart from the body 107 and the inner ring 202 such that a flow path is provided therebetween for a purge gas provided to a lower portion of the process chamber to flow from the bottom of the process chamber, between the flange 208 and the body 107 (and inner ring 202), through the gap between the outer ring 206 and the flange 208 (e.g., as maintained by protrusions 210), and to the one or more openings 138 of the exhaust 130.

A first opening 212 may be formed between the inner ring 202 and the outer ring 206 as illustrated in FIG. 2. The first opening 212 may fluidly couple the space 122 to the one or more openings of the upper exhaust 132, for example, such as between the opening formed between the flange 208 and the outer ring 206.

Figure 3:
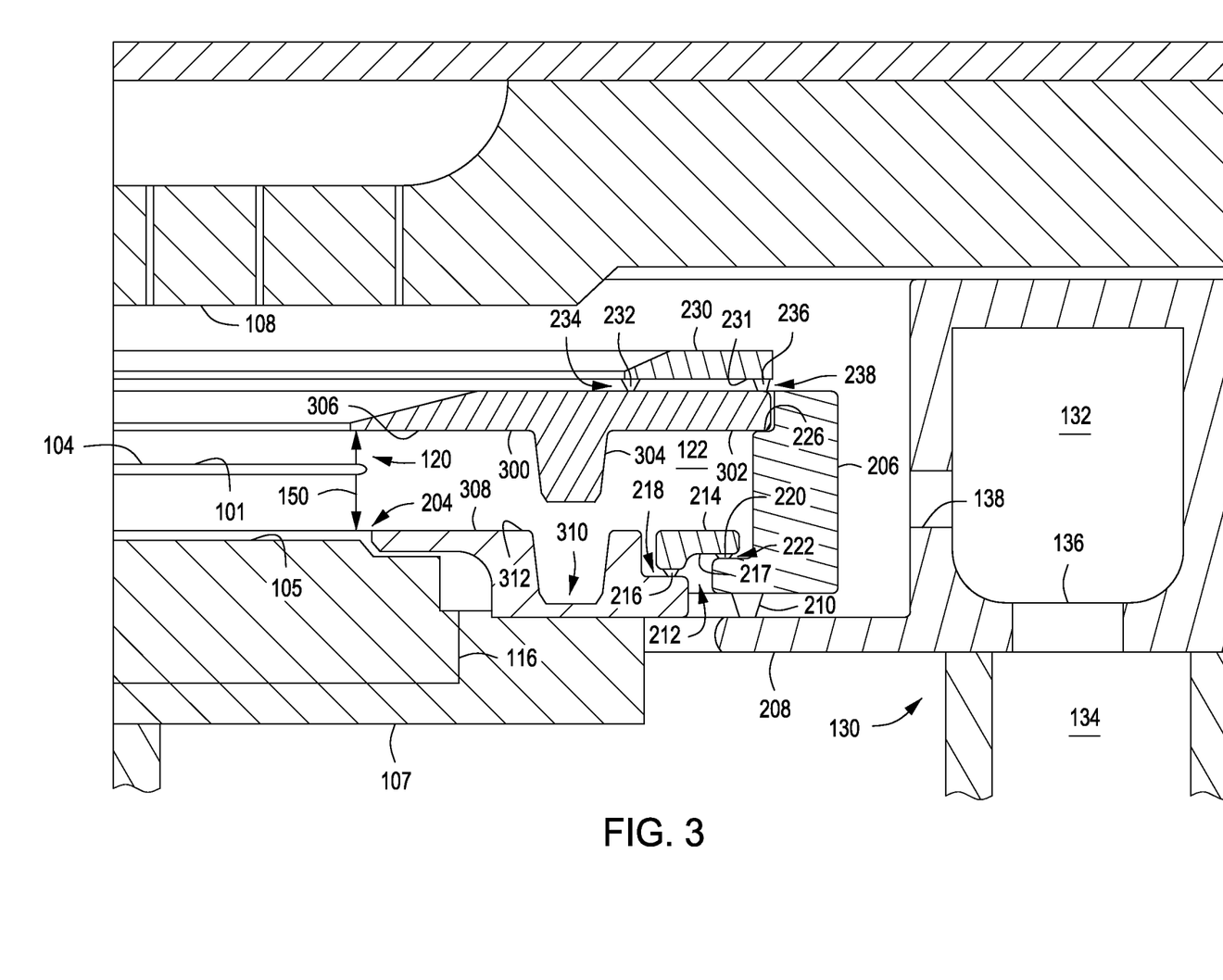
FIG. 3 depicts a detailed cross-sectional side view of a portion of a process chamber in accordance with some embodiments of the present invention.

A first seal ring 214 may be disposed above the first opening 212 (e.g., resting on the inner ring 202 and the outer ring 206 and spanning the first opening 212). The first seal ring 214 may be used to at least partially control the flow of a purge gas from the space 122 to the exhaust 130 through the first opening 212. For example, the first seal ring 214 may include a plurality of first protrusions 216 extending from a first opening-facing surface 217 of the first seal ring 214. The plurality of first protrusions 216 space the first seal ring 214 from the inner ring 202 to define a gap 218 between the inner ring 202 and the first seal ring 214, as illustrated in FIGS. 2-3. The gap 218 fluidly couples the space 122 to the first opening 212. Similarly, the first seal ring 214 may include a plurality of second protrusions 220 extending from the first opening-facing surface 217 of the first seal ring 214. The plurality of second protrusions 220 space the first seal ring 214 from the outer ring 206 to define a gap 222 between the outer ring 206 and the first seal ring 214. The gap 222 also fluidly couples the space 122 to the first opening 212. The height of each of the first or second protrusions 216, 220 may be adjusted to control the size of the gaps 218, 222, to control the flow of a purge gas from the space 122 through the first opening 212. In some embodiments, the height of each of the first and second protrusions 216, 220 may be selected such that the gaps 218, 222 (e.g., second gaps) are smaller than the first gap 120. For example, the height may be selected such that the first and/or second gaps 218, 222 choke the flow of a purge gas flowing through the first and/or second gaps 218, 222 from the space 122 to the exhaust 130 via the first opening 212 such that the purge gas flowing through the space 122 flows out of the first gap 120 when the substrate 104 is present on the substrate support 109.

The shadow ring 112 may be disposed above the inner ring 202 as illustrated in FIG. 2. For example, the shadow ring 112 may comprise any suitable material, such as aluminum nitride, alumina ($Al_2O_3$), or the like. The shadow ring may extend inwardly from the outer ring 206. The shadow ring 112 may have a plurality of outwardly extending tabs 224 extending from an outer ring-facing surface 225 of the shadow ring 112 that rest on corresponding shelves 226 disposed in the shadow ring-facing surface 227 of the outer ring 206. A second opening 228 may be formed between the shadow ring 112 and the outer ring 206. For example, the second opening 228 may have a width approximately equivalent to the length of each tab 224.

Similar to the first opening 212, the second opening 228 may fluidly couple the space 122 to the exhaust 130. A second seal ring 230 may be used to control the flow of a purge gas through the second opening 228. For example, and similarly as discussed above for the first seal ring 214 and first opening 212, the control of the flow of the purge gas through the second opening 228 may be utilized to facilitate flow and/or control flow rate of the purge gas from the space 122 through the first gap 120. The second seal ring 230 may include a plurality of first protrusions 232 extending from a second opening-facing surface 231 of the second seal ring 230. The plurality of first protrusions 232 space the second seal ring 230 from the shadow ring 112 to form a gap 234 between the shadow ring 112 and the second seal ring 230. The gap 234 is fluidly coupled to the space 122 via the second opening 228. Similarly, the second seal ring 230 may include a plurality of second protrusions 236 extending from the second opening-facing surface 231 of the second seal ring 230. The plurality of second protrusions 236 space the second seal ring 230 from the shadow ring 112 to form a gap 238 between the second seal ring 230 and the outer ring 206. The gap 238 is fluidly coupled to the space 122 via the second opening 228. The gaps 234, 238 (e.g., second gaps) may be utilized to control the flow of the purge gas from the second opening 228 to the exhaust 130 in the same manner as discussed above with respect to gaps 218, 222, such that flowing through the space 122 flows out of the first gap 120 when the substrate104 is present on the substrate support 109.

Figures 4, 5:
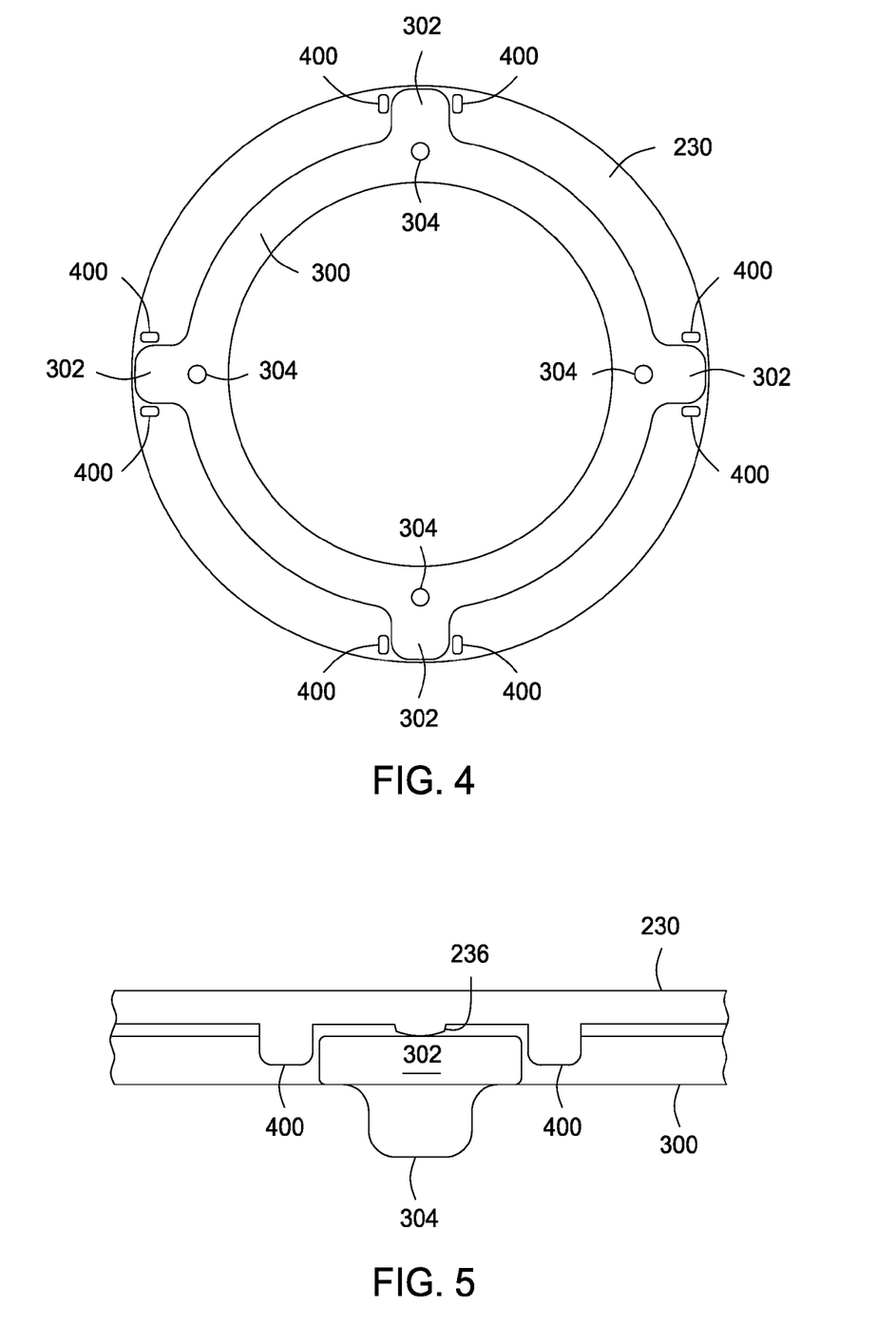
FIG. 4 depicts a schematic bottom view of a portion of a substrate support in accordance with some embodiment of the present invention.
FIG. 5 depicts a schematic side view of a portion of a substrate support in accordance with some embodiments of the present invention.

Alternatively, other embodiments of the shadow ring are possible. For example, as illustrated in FIGS. 3-5, a shadow ring 300 may be a single fabricated piece including one or more of a plurality of tabs 302 or a plurality of alignment pins 304. Further embodiments of the second seal ring 230 which may be utilized with embodiments of the shadow ring 300 are illustrated in FIGS. 4-5. Other embodiments of the system 100, such as discussed above may be compatible with the shadow ring 300 unless specifically mentioned below.

For example, the plurality of tabs 302 may be an integrated piece of the shadow ring 302 extending from an outer ring-facing surface (not shown) of the shadow ring 300. Each tab 302 may rest in a corresponding shelf 226 of the outer ring 206 similar to each tab 224.

The shadow ring 300 may include the plurality of alignments pins 304 extending from a space-facing surface 306 of the shadow ring 300. For example, the alignment pins 304 may be used to align the shadow ring 300 with the showerhead 108 and/or the substrate-facing surface 103 of the body 107 as a gap 150 is varied. The gap 150 may be defined between space-facing surfaces of the shadow ring 300 (or shadow ring 112) and an inner ring 308 (or the inner ring 202) and is discussed below. Each alignment pin 304 may be at least partially disposed in a corresponding alignment hole 310 of a plurality of alignment holes 310 disposed in a space-facing surface 312 of the inner ring 308 as a distance of the gap 150 is varied.

As illustrated in the bottom view of the shadow ring 300 in FIG. 4, each alignment pin 304 may be aligned with a corresponding tab 302 along the shadow ring 300. However, the embodiments of the shadow ring 300 as illustrated in FIG. 4 are merely exemplary and other configurations of the shadow ring 300 may use any suitable number of tabs 302 and/or alignment pins 304 and are not limited to 4 of each as illustrated in FIG. 4.

As illustrated in FIGS. 4-5, the second seal ring 230 may include a plurality of alignment guides 400, which may be utilized with embodiments of the shadow ring 300. For example, as illustrated in the upward looking view of FIG. 4 and the side schematic view of FIG. 5, a pair or alignment guides 400 may straddle either side of the a corresponding tab 302. For example, the alignment guides 400 may keep the second seal ring 230 aligned with the shadow ring 300 such that the first and second protrusions 232,236 (aligned with and/or resting on each tab 302 as illustrated in FIG. 5) continue to define the first and second passages 234, 238 as discussed above.

Returning to FIG. 2, the space 122 may be at least partially defined by the body 107, the inner and outer rings 202, 206, and the shadow ring 112 (and the substrate 104 when present). However, the space 122 may similarly be defined using the shadow ring 300 and the inner ring 308 as illustrated in FIG. 3. As shown in FIG. 2, the gap 150 may be defined between a space-facing surface 111 of the shadow ring 112 and a space-facing surface 201 of the inner ring 202. The gap 150 may include the first gap 120 where the first gap 120 may be defined between a processing surface 101 of the substrate 104 and the space-facing surface 111 of the shadow ring 112.

The first gap 120 of the space 122 may be controlled via control of the position of the substrate 104 and/or control over the position of the shadow ring 112. Positioning the substrate 104 may be used to obtain the desired spacing, h1 and h2, as discussed above. Upon selection of a desired position of the substrate 104, the size of the first gap 120 may be controlled via control over the position of the shadow ring 112. In some embodiments, such as that shown in FIG. 2, the position of the shadow ring 112 may be controlled via selection of the height of each shelf 226 of the outer ring 206. Alternatively, or in combination, the first gap 120 may be controlled by controlling the position of each support pin 110 relative to the space-facing surface 111 of the shadow ring 112.

The system 100 may include a controller 160 to control various components of the system 100. The controller 160 may comprises a central processing unit (CPU) 162, a memory 164, and support circuits 166 for the CPU 162 and facilitates control of the components of the system 100 and, as such, methods of processing a substrate in the system 100 as discussed below. The controller 160 may be one of any form of general-purpose computer processor that can be used in an industrial setting for controlling various chambers and sub-processors. The memory, or computer-readable medium, 164 of the CPU 162 may be one or more of readily available memory such as random access memory (RAM), read only memory (ROM), floppy disk, hard disk, or any other form of digital storage, local or remote. The support circuits 166 are coupled to the CPU 162 for supporting the processor in a conventional manner. These circuits include cache, power supplies, clock circuits, input/output circuitry and subsystems, and the like. The memory 164 stores software (source or object code) that may be executed or invoked to control the operation of the system 100 in the manner described herein. The software routine may also be stored and/or executed by a second CPU (not shown) that is remotely located from the hardware being controlled by the CPU 162.

Figure 6:
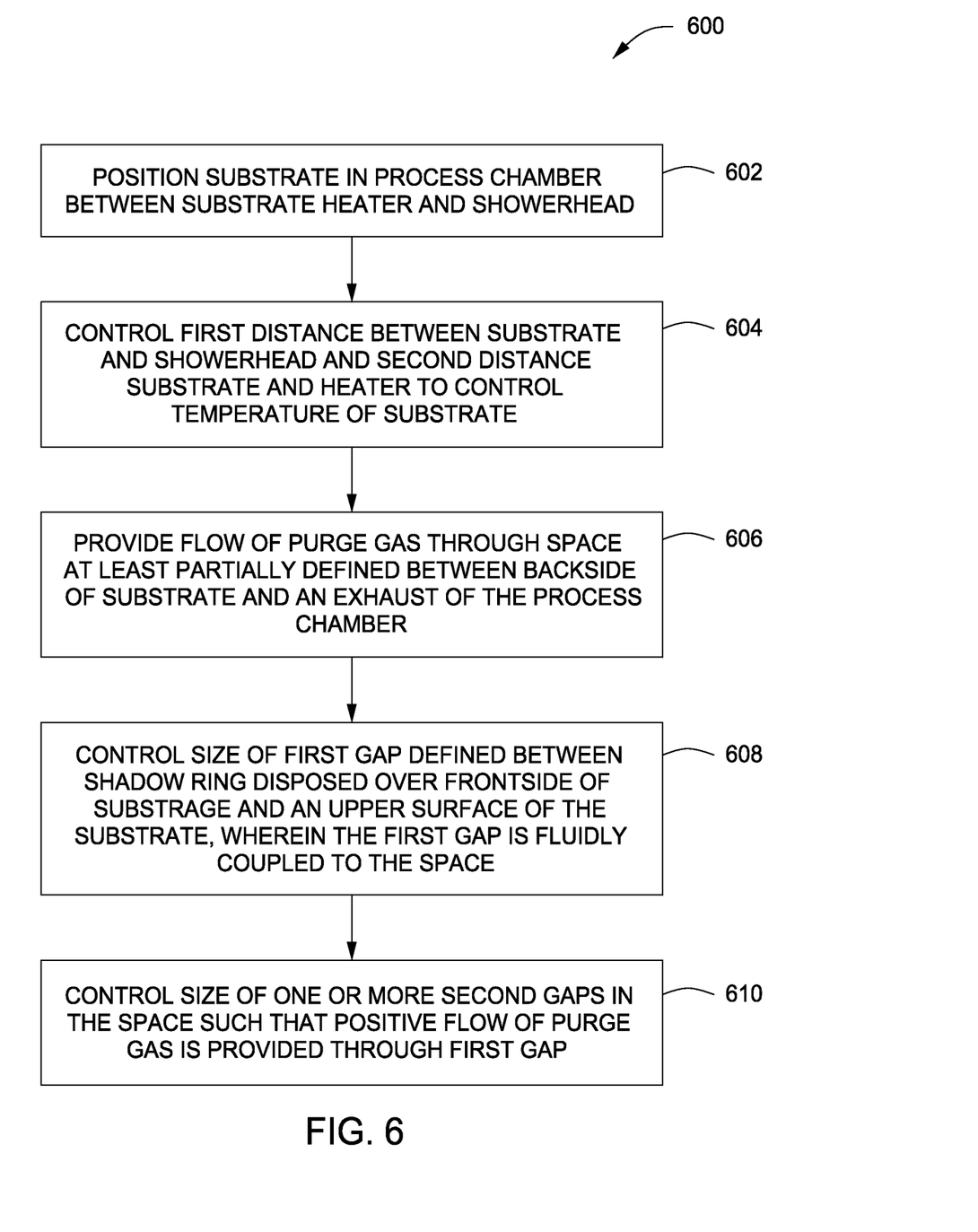
FIG. 6 depicts a flow chart for a method for processing a substrate in accordance with some embodiments of the present invention.

The inventive apparatus discussed herein may be used to perform various methods of processing a substrate. For example, FIG. 6 depicts a flow chart of a method 600 of processing a substrate in accordance with some embodiments of the present invention. The method 600 may be performed in accordance with embodiments of the system 100 illustrated in FIGS. 1-5, discussed above.

The method 600 generally begins at 602 by positioning the substrate 104 in the process chamber 102 between the heater 106 and the showerhead 108. For example, the substrate 104 may be supported above the heater 106 on the plurality of support pins 110.

At 604, the first distance (e.g., h1) between the substrate 104 and the showerhead 108 and the second distance (e.g., h2) between the substrate 104 and the heater 106 may be controlled to control a temperature of the substrate 104. For example, the first distance h1 can be controlled in any suitable manner as discussed above, such as by moving the support pins 110 and/or the body 107 relative to the showerhead 108 to position the substrate and change the first distance h1. Similarly, the second distance h2 may be controlled in any suitable manner as discussed above. For example, the body 107 may be moved relative to the support pins to control the second distance h2 without impacting the first distance h1.

At 606, a flow of a purge gas may be provided through the space 122. The purge gas may be provided to the space via the one or more conduits 116, as discussed above. For example, the purge gas may be provided to the space through conduits 116 having openings in the substrate-facing surface 103 and/or the passage 204 disposed between the body 107 and the inner ring 202. The purge gas may be any suitable purge gas, such as one or more of an inert gas (such as argon (Ar), helium (He), or the like), or a reducing gas (such as hydrogen ($H_2$)), or the like. The purge gas may be provided at any suitable flow rate necessary to provide a positive purge gas flow through the first gap 120 when the substrate 104 is being processed in the process chamber 102.

At 608, the size of the first gap 120 defined between the shadow ring 112 and the processing surface of the substrate 104 may be controlled. For example, as discussed above the first gap 120 may be adjusted in any number of suitable methods. For example, the support pins 110 may be moved relative to the shadow ring 112 to adjust the first gap 120. Alternatively or in combination, the dimensions of one or more of the outer ring 206, the protrusions 210, the one or more shelves 226, or the like, may be adjusted or selected to control the position of the shadow ring 112 relative to the substrate 104 to control the size of the first gap 120.

At 610, the size of one or more second gaps (e.g., gaps 218, 222, 232, 238) fluidly coupling the space 122 to the exhaust 130 may be controlled such that a positive flow of the purge gas is provided through the first gap 120. As discussed above, control of the purge gas through the gaps 218, 222, 232, 238 may be controlled by various embodiments of the respective first and second seal rings 214, 230 which at least partially control the flow of the purge gas through each respective opening 212, 228. For example, as discussed above, the height of each protrusion extending from each seal ring 214, 230 may be selected such that the gaps 218, 222, 232, 238 choke the flow of the purge gas through the gaps 218, 222, 232, 238. For example, the height of each protrusion may be selected such that each gap 218, 222, 232, 238 is smaller than the first gap 120.

For example, the purge gas provided through the one or more conduits 116 may cause the flow of the purge gas from the center of the space 122 radially outward, for example, towards the outer ring 206. By providing a desired flow rate of purge gas and/or by choking the flow of the purge gas through the gaps 218, 222, 232, 238 the purge gas may desirably flow out of the first gap 120 towards the processing surface of the substrate 104.

In operation, the positive flow of the purge gas may substantially prevent process gases from depositing on the backside of the substrate 104. For example, in a chemical vapor deposition process when one or more process gases are provided through the showerhead 108 to deposit a film on the processing surface of the substrate 104, the positive flow of the purge gas may substantially prevent process gases from undesirably depositing on the backside of the substrate 104. In some embodiments, the film being deposited may comprise tungsten (W).

While the foregoing is directed to embodiments of the present invention, other and further embodiments of the invention may be devised without departing from the basic scope thereof.

The invention claimed is:

1. Apparatus for processing a substrate, comprising:
   a substrate support, comprising:
      a body having a substrate-facing surface;
      an inner ring disposed about the body;
      an outer ring disposed about the inner ring, wherein a first opening is formed between the inner and outer rings;
      a first seal ring disposed above the first opening;
      a shadow ring disposed above the inner ring, the shadow ring extending inward from the outer ring, wherein a second opening is formed between the shadow ring and the outer ring;
      a second seal ring disposed above the second opening;
      a space at least partially defined by the body, the inner ring, the outer ring, the first seal ring, the second seal ring, and the shadow ring;
      a first gap defined between a processing surface of a substrate when present on the substrate support and a space-facing surface of the shadow ring; and
      a plurality of second gaps, one second gap defined between each of the first seal ring and the inner ring, the first seal ring and the outer ring, the second seal ring and the shadow ring, and the second seal ring and the outer ring;
      wherein the first gap and the plurality of second gaps are configured such that, when a substrate is disposed between the body and the shadow ring, a gas provided to the space flows out of the space through the first gap, and
      wherein the first gap is larger than each of the plurality of second gaps.

2. The apparatus of claim 1, wherein the first seal ring further comprises:
   a plurality of first protrusions extending from a first opening-facing surface of the first seal ring, wherein the plurality of first protrusions space the first seal ring away from the inner ring to define a second gap between the inner ring and the first seal ring fluidly coupling the space to the first opening; and
   a plurality of second protrusions extending from the first opening-facing surface of the first seal ring, wherein the plurality of second protrusions space the first seal ring away from the outer ring to define a second gap between the outer ring and the first seal ring fluidly coupling the space to the first opening.

3. The apparatus of claim 1, wherein the second seal ring further comprises:
   a plurality of first protrusions extending from a second opening-facing surface of the second seal ring, wherein the plurality of first protrusions space the second seal ring away from the shadow ring to define a second gap between the shadow ring and the second seal ring fluidly coupling the space to the second opening; and
   a plurality of second protrusions extending from the second opening facing surface of the second seal ring, wherein the plurality of second protrusions space the second seal ring away from the outer ring to define a second gap between the outer ring and the second seal ring fluidly coupling the space to the second opening.

4. The apparatus of claim 1, wherein the outer ring further comprises one or more shelves disposed in a shadow ring facing surface of the outer ring, and wherein the shadow ring further comprises a plurality of tabs extending from an outer ring facing surface of the shadow ring, wherein each tab of the plurality of tabs rests in one shelve of the plurality of shelves.

5. The apparatus of claim 1, wherein the shadow ring further comprises:
a plurality of alignment pins extending from the space-facing surface of the shadow ring; and wherein the inner ring further comprises:
a plurality of alignment holes disposed in a space-facing surface of the inner ring, wherein each alignment pin of the plurality of alignment pins can be at least partially disposed in one alignment hole of the plurality of alignment holes as a distance between the shadow ring and the inner ring is varied.

6. The apparatus of claim 1, further comprising:
one or more conduits coupled to the space via the body to provide a purge gas to the space.

7. The apparatus of claim 6, wherein the one or more conduits comprises a plurality of conduits, wherein at least one of the conduits has an opening disposed between the body and the inner ring to provide the purge gas proximate a peripheral edge of the substrate.

8. The apparatus of claim 1, further comprising:
a plurality of support pins to support the substrate when present on the substrate support, wherein each support pin is moveable relative to the substrate-facing surface of the body to control a distance between the substrate when present on the plurality of support pins and the substrate-facing surface of the body.

9. The apparatus of claim 1, further comprising:
a substrate heater disposed in the body.

10. The apparatus of claim 1, further comprising:
a substrate heater configured to heat the substrate.

11. The apparatus of claim 1, further comprising:
a processing chamber having an inner volume;
an inlet to provide a process gas to the inner volume; and
an exhaust coupled to the inner volume to facilitate removal of one or more gases from the process chamber;
wherein the substrate support is disposed in the inner volume and below the inlet.

12. The apparatus of claim 11, wherein the exhaust is disposed about the substrate support and further comprises:
one or more openings disposed about the substrate support, wherein each opening of the exhaust is fluidly coupled to the space via the first gap and the plurality of second gaps.

* * * * *